United States Patent
Hwang

(10) Patent No.: US 9,429,618 B2
(45) Date of Patent: Aug. 30, 2016

(54) SEMICONDUCTOR INTEGRATED CIRCUIT DEVICE HAVING FUNCTION FOR DETECTING DEGRADATION OF SEMICONDUCTOR DEVICE AND METHOD OF DRIVING THE SAME

(71) Applicant: SK hynix Inc., Icheon-si, Gyeonggi-do (KR)

(72) Inventor: Jeong Tae Hwang, Icheon-si (KR)

(73) Assignee: SK hynix Inc., Icheon-si, Gyeonggi-do (*) Notice: Subject to any disclaimer, the term of this patent is extended or adjusted under 35 U.S.C. 154(b) by 0 days.

(21) Appl. No.: 14/723,833

(22) Filed: May 28, 2015

(65) Prior Publication Data

US 2016/0223609 A1    Aug. 4, 2016

(30) Foreign Application Priority Data

Jan. 30, 2015   (KR) .......................... 10-2015-0015408

(51) Int. Cl.
| | | |
|---|---|---|
| *H03K 19/00* | (2006.01) | |
| *G01R 31/28* | (2006.01) | |
| *H03K 19/0185* | (2006.01) | |
| *H03K 3/356* | (2006.01) | |
| *H03K 17/10* | (2006.01) | |
| *H03K 17/687* | (2006.01) | |

(52) U.S. Cl.
CPC ....... *G01R 31/2856* (2013.01); *G01R 31/2874* (2013.01); *H03K 3/356104* (2013.01); *H03K 17/102* (2013.01); *H03K 17/6872* (2013.01); *H03K 19/0005* (2013.01); *H03K 19/018521* (2013.01)

(58) Field of Classification Search
CPC ..................... H03K 19/00315; H03K 17/102; H03K 17/6872; H03K 19/0005; H03K 19/0016; H03K 19/00361; H03K 19/018521; H03K 3/356104; H01L 27/092; G01R 31/2621; G01R 31/2856; G01R 31/2874
See application file for complete search history.

(56) References Cited

U.S. PATENT DOCUMENTS

| | | | | |
|---|---|---|---|---|
| 6,157,216 A | * | 12/2000 | Lattimore | ........ H03K 19/01707 326/17 |
| 8,786,307 B2 | | 7/2014 | Jain | |
| 2010/0318313 A1 | | 12/2010 | Agarwal et al. | |
| 2011/0199837 A1 | * | 8/2011 | Reohr | ................. G11C 11/4085 365/189.06 |

FOREIGN PATENT DOCUMENTS

| | | | |
|---|---|---|---|
| KR | 1020000056020 A | 9/2000 | |
| WO | WO 2007036020 A1 * | 4/2007 | ......... H03K 19/0016 |

* cited by examiner

*Primary Examiner* — Vibol Tan

(74) *Attorney, Agent, or Firm* — William Park & Associates Ltd.

(57) ABSTRACT

A semiconductor integrated circuit device having a function for detecting degradation of a semiconductor device and a method of driving the same are disclosed. The semiconductor integrated circuit device includes an NMOS transistor electrically coupled to a PMOS transistor and configured to constitute an inverter together with the PMOS transistor, a first stress application unit electrically coupled to the PMOS transistor and configured to apply stress to the PMOS transistor, and a second stress application unit electrically coupled to the NMOS transistor and configured to apply the stress to the NMOS transistor.

27 Claims, 15 Drawing Sheets

SEMICONDUCTOR INTEGRATED CIRCUIT DEVICE HAVING FUNCTION FOR DETECTING DEGRADATION OF SEMICONDUCTOR DEVICE AND METHOD OF DRIVING THE SAME

CROSS-REFERENCES TO RELATED APPLICATION

This application claims priority under 35 U.S.C. 119(a) to Korean application No. 10-2015-0015408, filed on Jan. 30, 2015, in the Korean intellectual property Office, which is incorporated by reference in its entirety as set forth in full.

BACKGROUND

1. Technical Field

The inventive concept relates to a semiconductor integrated circuit device and a method of driving the same, and more particularly, to a semiconductor integrated circuit device including a function for detecting degradation of a semiconductor device and a method of driving the same.

2. Related Art

The bias-temperature-instability (hereinafter, referred to as BTI) characteristic which induces the degradation of semiconductor devices may reduce lifespan of the semiconductor devices.

Currently, to detect the BTI characteristic, the degree of degradation is measured by applying various stress sources to a CMOS inverter circuit. The degree of degradation in BTI may be changed according to a stress voltage, a temperature, a wave conversion period, or the like. Characteristics of transistors in which stress is received, for example, a threshold voltage, a drive current Idsat, and the like may be changed.

As well-known, the CMOS inverter is configured of a combination of an NMOS transistor and a PMOS transistor. Thus, when stress is applied to the CMOS transistor, the degree of degradation in the CMOS inverter is measured based on an amount of current in an output node which is a connection node of the NMOS transistor and the PMOS transistor.

Only the integrated stress of the NMOS transistor and the PMOS transistor may be represented through above-described method, and it is difficult to measure the degree of degradation in each of the NMOS transistor and the PMOS transistor.

SUMMARY

According to an embodiment, there is provided a semiconductor integrated circuit device. The semiconductor integrated circuit device may include an NMOS transistor electrically coupled to a PMOS transistor and configured to constitute an inverter together with the PMOS transistor. The semiconductor integrated circuit device may also include a first stress application unit electrically coupled to the PMOS transistor and configured to apply stress to the PMOS transistor. The semiconductor integrated circuit device may also include a second stress application unit electrically coupled to the NMOS transistor and configured to apply the stress to the NMOS transistor.

According to an embodiment, there is provided a semiconductor integrated circuit device. The semiconductor integrated circuit device may include an inverter including a PMOS transistor and an NMOS transistor. The semiconductor integrated circuit device may also include an input unit configured to transfer an input signal to gates of the PMOS transistor and the NMOS transistor. The semiconductor integrated circuit device may also include a first stress application unit electrically coupled between the gate and a drain of the PMOS transistor and configured to apply stress to the PMOS transistor. The semiconductor integrated circuit device may also include a second stress application unit electrically coupled between the gate and a drain of the NMOS transistor and configured to apply stress to the NMOS transistor. Further, the semiconductor integrated circuit device may include a first output terminal unit withdrawn from an output node of the inverter. The semiconductor integrated circuit device may also include a second output terminal unit withdrawn from a source node of the PMOS transistor. In addition, the semiconductor integrated circuit device may also include a loop forming unit configured to electrically couple a source node of the NMOS transistor and the second output terminal unit.

According to an embodiment, there is provided a method of measuring degree of degradation in each of a PMOS transistor and an NMOS transistor in an inverter structure including the PMOS transistor and the NMOS transistor. The method may include measuring an initial first current path flowing through the PMOS transistor in a state in which a current path flowing through the NMOS transistor is blocked. The method may also include applying stress to the PMOS transistor by providing a gate-drain voltage of the PMOS transistor having a negative level. The method may also include measuring a first current path flowing through the PMOS transistor in which the stress is received. The method may also include measuring the degree of degradation in the PMOS transistor through a variation of the first current path.

According to an embodiment, there is provided a semiconductor integrated circuit device. The semiconductor integrated circuit device may include: first and second transistors driven by a first power voltage or a second power voltage and electrically coupled to be driven as an inverter in a stress application mode. The semiconductor integrated circuit device may also include a selection cutting circuit unit selectively electrically coupled to the first and second transistors, and configured to allow a degree of degradation to be separately measured in the first and second transistors in a measurement mode.

DETAILED DESCRIPTION

Figure 1:
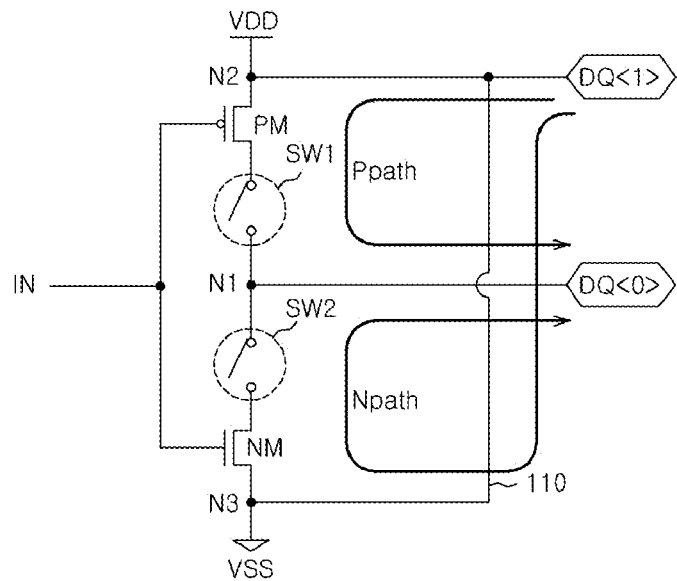
FIG. 1 is a schematic circuit diagram explaining a concept of a semiconductor integrated circuit device according to an embodiment of the inventive concept.

Hereinafter, various embodiments will be described in greater detail with reference to the accompanying figures. Various embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, various embodiments should not be construed as limited to the particular shapes of regions illustrated herein but may be to include deviations in shapes that result, for example, from manufacturing. In the figures, lengths and sizes of layers and regions may be exaggerated for clarity. Like reference numerals in the figures denote like elements. It is also understood that when a layer is referred to as being "on" another layer or substrate, it can be directly on the other or substrate, or intervening layers may also be present.

The inventive concept is described with reference to cross-section and/or plan illustrations that are schematic illustrations of embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these various embodiments without departing from the principles and spirit of the inventive concept.

Referring to FIG. 1, a degradation characteristic detecting apparatus 100 according to an embodiment of the inventive concept may include an inverter including a PMOS transistor PM and an NMOS transistor NM, a first switching unit SW1, a second switching unit SW2, a first output terminal unit DQ<0>, and a second output terminal unit DQ<1>.

The first switching unit SW1 may be electrically coupled between the PMOS transistor PM and a first node N1 which is an output node of the inverter. Further, the second switching unit SW2 may be electrically coupled between the first node N1 and the NMOS transistor NM.

The first output terminal unit DQ<0> may be withdrawn from the first node N1. In addition, the second output terminal unit DQ<1> may be withdrawn from a second node N2 corresponding to a source of the PMOS transistor PM.

The degradation characteristic detecting apparatus 100 may further include a loop forming unit 110 configured to electrically couple a source (hereinafter, referred to as third node N3) of the NMOS transistor NM and the second output terminal unit DQ<1>. The loop forming unit 110 may be, for example, a wiring for electrically coupling the second output terminal DQ<1> and the source of the NMOS transistor NM.

In an embodiment, the PMOS transistor PM and the NMOS transistor NM may receive stress through a terminal of an input signal IN.

When the first and second switching units SW1 and SW2 are selectively operated, first and second current paths Ppath and Npath may be selectively formed between the first output terminal unit DQ<0> and the second output terminal unit DQ<1> according to the degree of degradation in the PMOS transistor PM and the NMOS transistor NM.

For example, the first current path Ppath may be formed between the second output terminal unit DQ<1> and the first output terminal unit DQ<0> through the PMOS transistor PM when the first switching unit SW1 is closed and the PMOS transistor is turned off. The degree of degradation of the PMOS transistor PM itself may be determined by a current amount of the first current path Ppath. At that time, the first and second switching units SW1 and SW2 are designed so that when the first current path Ppath is formed, the first switching unit SW1 is closed, and the second switching unit SW2 is opened. Accordingly, the second current path Npath is not formed.

The second current path Npath may be formed between the second output terminal unit DQ<1> and the first output terminal unit DQ<0> through the loop forming unit 110 and the NMOS transistor NM when the second switching unit SW2 is closed and the NMOS transistor is turned off. The degree of degradation of NMOS transistor itself may be measured by a current amount of the second current path Npath. At that time, the first and second switching units SW1 and SW2 are designed so that when the second current path Npath is formed, the first switching unit SW1 is opened, and the second switching unit SW2 is closed. As a result, the first current path Ppath is not formed.

As above, the measurement on the first or second current path Ppath or Npath may be performed in the state that the PMOS transistor PM and the NMOS transistor NM are turned off. In the state that the first and second switching units SW1 and SW2 are selectively driven, and the input signal IN is gradually increased, the current paths Ppath and Npath may be selectively formed.

Figure 2:
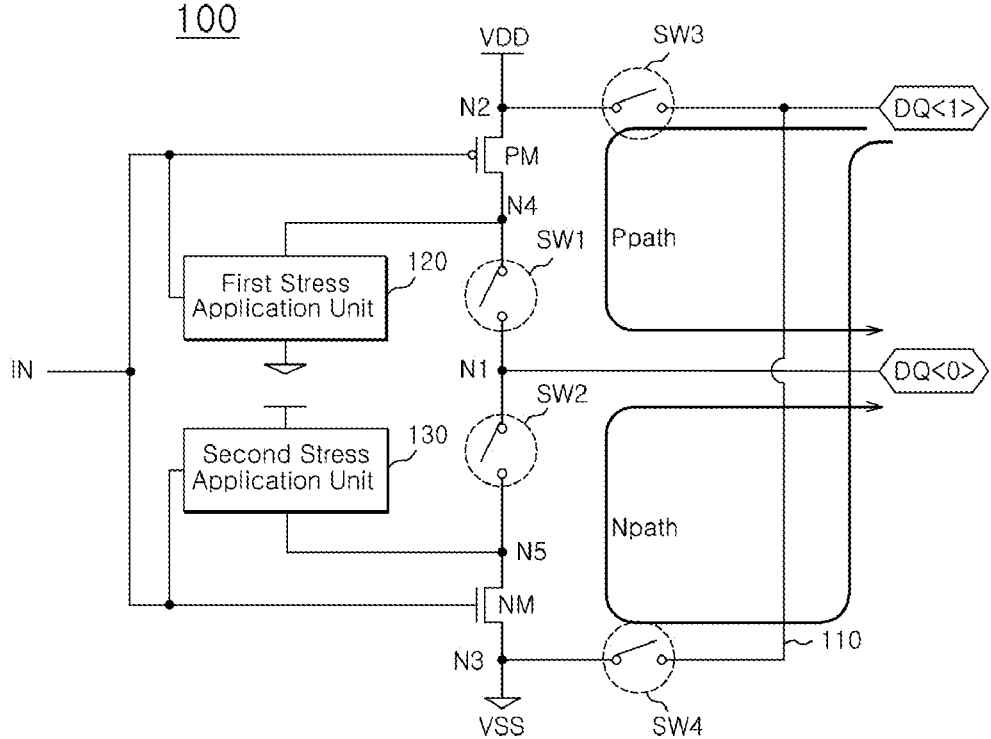
FIG. 2 is a circuit diagram illustrating a semiconductor integrated circuit device according to an embodiment of the inventive concept.

Referring to FIG. 2, the degradation characteristic detecting apparatus 100 in an embodiment may further include a first stress application unit 120, a second stress application unit 130, and a third switching unit SW3 and a fourth switching unit SW4. The third switching unit SW3 may be located between the second output terminal unit DQ<1> and the second node N2. The fourth switching unit SW4 may be located in the loop forming unit 110, for example, between the second output terminal unit DQ<1> and the third node N3.

The first stress application unit 120 may be electrically coupled between a gate and a drain node N4 of the PMOS transistor PM. The first stress application unit 120 may also form a stress providing condition so that a gate-drain voltage $V_{SD}$ (=VG-VD) of the PMOS transistor PM has a negative level.

Figure 3:
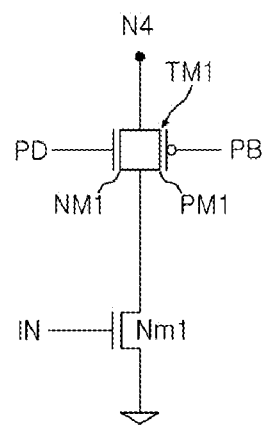
FIG. 3 is an internal circuit diagram illustrating a first stress application unit of FIG. 2.

For example, as illustrated in FIG. 3, the first stress application unit 120 may include a transfer gate TM1 and an NMOS transistor Nm1.

As well-known, the transfer gate TM1 may be configured of an NMOS transistor NM1 and a PMOS transistor PM1. The NMOS transistor NM1 may be driven by a first control signal PD, and the PMOS transistor PM1 may be driven by a second control signal PB. Further, the NMOS transistor Nm1 may be electrically coupled to the transfer gate TM1, and may be driven in response to the input signal IN.

Figure 4:
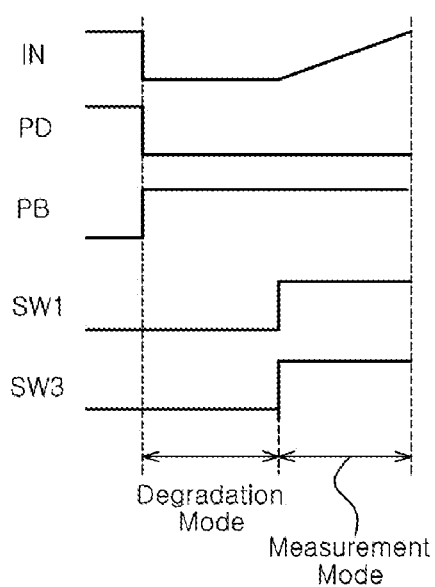
FIG. 4 is a timing chart illustrating signals for circuit operations of FIGS. 2 and 3.

A process for applying stress to the PMOS transistor PM through the first stress application unit 120 will be described with reference to FIG. 2 to FIG. 4.

For example, the input signal IN may be transited from a high level to a low level, the first control signal PD may be changed from a high level to a low level, and the second control signal PB may be changed from a low level to a high level.

Accordingly, the NMOS transistor Nm1 and the transfer gate TM1 of the first stress application unit 120 are turned off. As the input signal IN is transited to the low level, the PMOS transistor PM of the inverter is turned on, and the power voltage VDD is transferred to the drain node N4. The first stress application unit 120 allows a potential in the drain node N4 of the PMOS transistor PM to be maintained as the power voltage VDD by the first and second control signals PD and PB and the input signal IN.

Since the gate-drain voltage $V_{SD}$ (=VG-VD) of the PMOS transistor PM has a negative level, negative bias temperature instability (NBTI) condition is satisfied. In addition, the PMOS transistor PM itself is in the condition that the stress is received.

More detailed, in the measurement mode, the input signal IN is gradually transited from the low level to the high level. In addition, the first and third switching units SW1 and SW3 are driven. Thus, the first current path Ppath for measuring the degree of degradation of the PMOS transistor PM is generated. For example, when the PMOS transistor PM is not degraded, the first current path Ppath may not be formed in the state that the input signal IN has a high level. However, when the PMOS transistor PM is degraded through the degradation mode, since the leakage current is generated in the PMOS transistor PM although the PMOS transistor is turned off by the input signal IN, the first current path Ppath may be formed. The degree of degradation in the PMOS transistor PM itself may be measured through the current amount measured through the first current path Ppath.

The second stress application unit 130 may be electrically coupled between the gate and a drain node N5 of the NMOS transistor NM. The second stress application unit 130 may form the stress providing condition of the NMOS transistor NM so that the gate-drain voltage $V_{SD}$ (=VG-VD) of the NMOS transistor NM may have a positive level.

Figure 5:
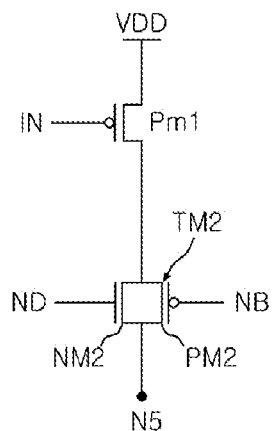
FIG. 5 is an internal circuit diagram illustrating a second stress application unit of FIG. 2.

Referring to FIG. 5, the second stress application unit 130 may include a transfer gate TM2 and a PMOS transistor Pm1.

An NMOS transistor NM2 constituting the transfer gate TM2 may be driven by a third control signal ND. Further, a PMOS transistor constituting the transfer gate TM2 may be driven by a fourth control signal NB. The PMOS transistor Pm1 may be electrically coupled to the transfer gate TM2, and may be driven in response to the input signal IN. The transfer gate TM2 is also illustrated.

Figure 6:
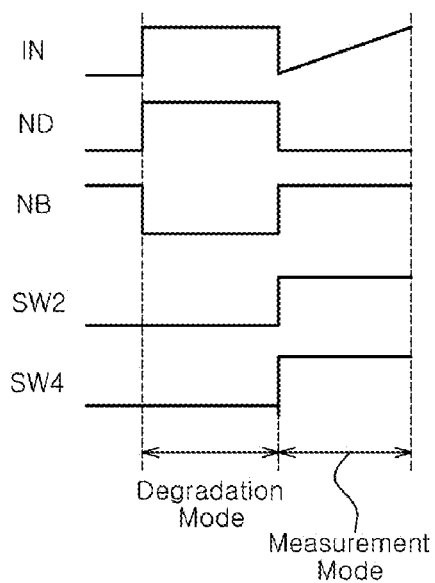
FIG. 6 is a timing chart illustrating signals for circuit operations of FIGS. 2 and 5.

A process of applying stress to the NMOS transistor NM constituting the inverter from the second stress application unit 130 will be described with reference to FIG. 6 below.

For example, the input signal IN may be transited from a low level to a high level, the third control signal ND may be changed from a low level to a high level, and the fourth control signal NB may be changed from a high level to a low level.

The PMOS transistor Pm1 of the second stress application unit 130 is turned off and the transfer gate TM2 is turned on. Thus, a voltage of the drain node N5 of the NMOS transistor NM may be dependent on a level of the first node N1. If an output level of the inverter was a low level before the process of applying stress to the NMOS transistor, the voltage of the drain node N4 of the NMOS transistor NM may be the low level. Since the input signal IN of the high level of a threshold voltage or more (≥Vt) is input as the gate voltage of the NMOS transistor NM during the measuring mode, the gate-drain voltage $V_{SD}$ (VG-VD) of the NMOS transistor NM becomes a positive level. Accordingly, the PMOS transistor PM itself is in the condition that the stress is received.

More detailed, in the measurement mode, the input signal IN is gradually transited from the low level to the high level. Further, the second and fourth switching units SW2 and SW4 are driven. The second current path Npath for measuring the degree of degradation of the NMOS transistor NM is formed. For example, when the NMOS transistor NM is not degraded, the second current path Npath may not be formed in the state that the input signal IN has a low level. However, when the NMOS transistor NM is degraded through the degradation mode, since the leakage current is generated in the NMOS transistor NM, the second current path Npath may be formed although the input signal IN has the low level. The degree of degradation in the NMOS transistor NM itself may be measured through the current amount measured through the second current path Npath.

Figure 7:
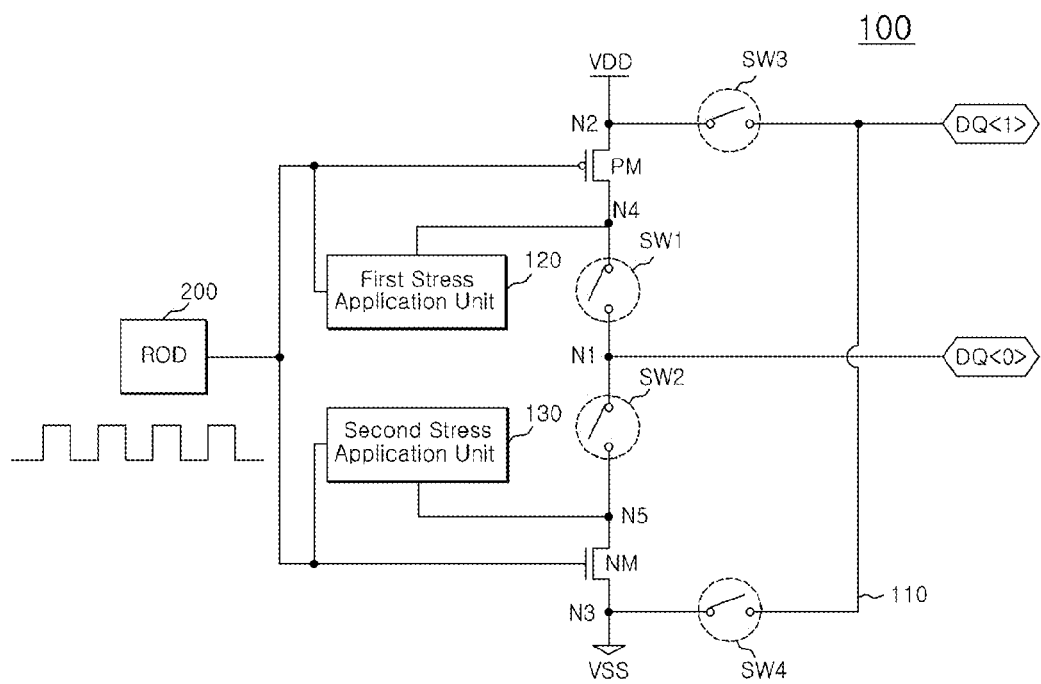
FIG. 7 is a circuit diagram illustrating a semiconductor integrated circuit device according to an embodiment of the inventive concept.
Figure 8:
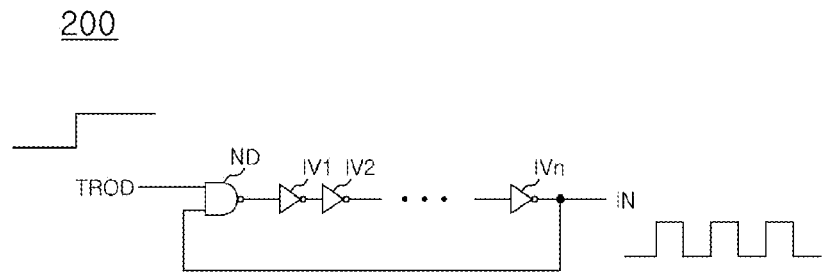
FIG. 8 is a detailed circuit diagram illustrating an oscillation signal generating unit of FIG. 7.

Referring to FIG. 7, the degradation characteristic detecting apparatus 100 may further include an oscillation signal generating unit 200 configured to generate an AC signal as the input signal IN. The oscillation signal generating unit 200 may be a ring oscillator delay (ROD) including a plurality of inverter chains IV1 to IVn as shown in FIG. 8. Further, the oscillation signal generating unit 200 may further include a NAND gate ND to which an enable signal TROD is input. The ROD may generate an oscillation signal according to the fabrication process condition for a corresponding semiconductor device, an operation voltage, and a period (or frequency) determined by an operation temperature.

Figure 9:
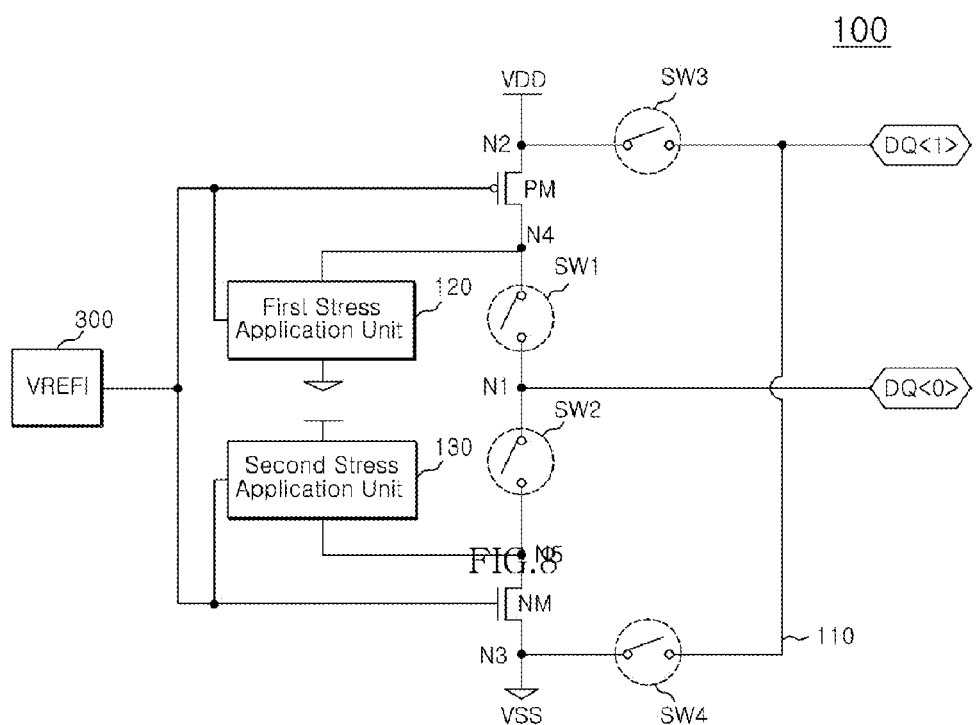
FIG. 9 is a circuit diagram illustrating a semiconductor integrated circuit device according to an embodiment of the inventive concept.

Referring to FIG. 9, the degradation characteristic detecting apparatus 100 may further include an internal voltage generating unit 300 configured to generate an internal voltage VREFI as the input signal IN. The internal voltage generating unit 300 in an embodiment may include any voltage generating unit configured to receive an external voltage and generate a suitable internal voltage.

Figure 10:
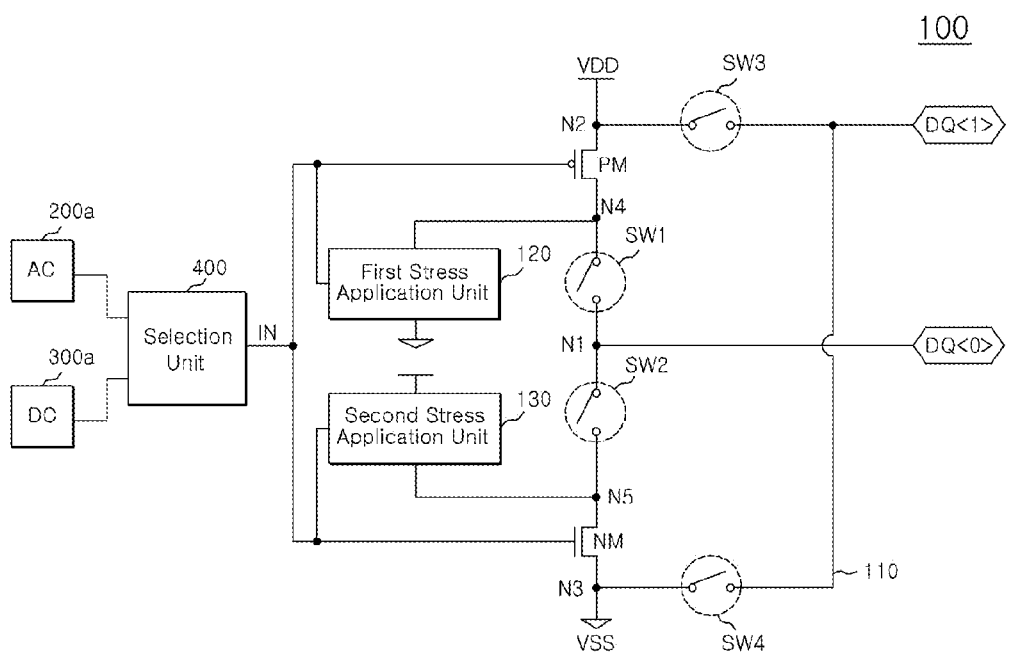
FIG. 10 is a circuit diagram illustrating a semiconductor integrated circuit device according to an embodiment of the inventive concept.

Referring to FIG. 10, the degradation characteristic detecting apparatus 100 may further include an AC input signal generating unit 200a, a DC input signal generating unit 300a, and an input signal selection unit 400.

Any one of input signals generated by the AC input signal generating unit 200a and the DC input signal generating unit 300a may be selected by the input signal selection unit 400. Further, any one of the input signals may be provided as an input signal of the degradation characteristic detecting apparatus 100. Further an input signal of the inverter may be an AC input signal and/or a DC input signal.

Here, the AC input signal generating unit 200a may be the oscillation signal generating unit 200 as illustrated in FIGS. 7 and 8. In addition, the DC input signal generating unit 300a may correspond to the internal voltage generating unit 300 as illustrated in FIG. 9.

Figure 11:
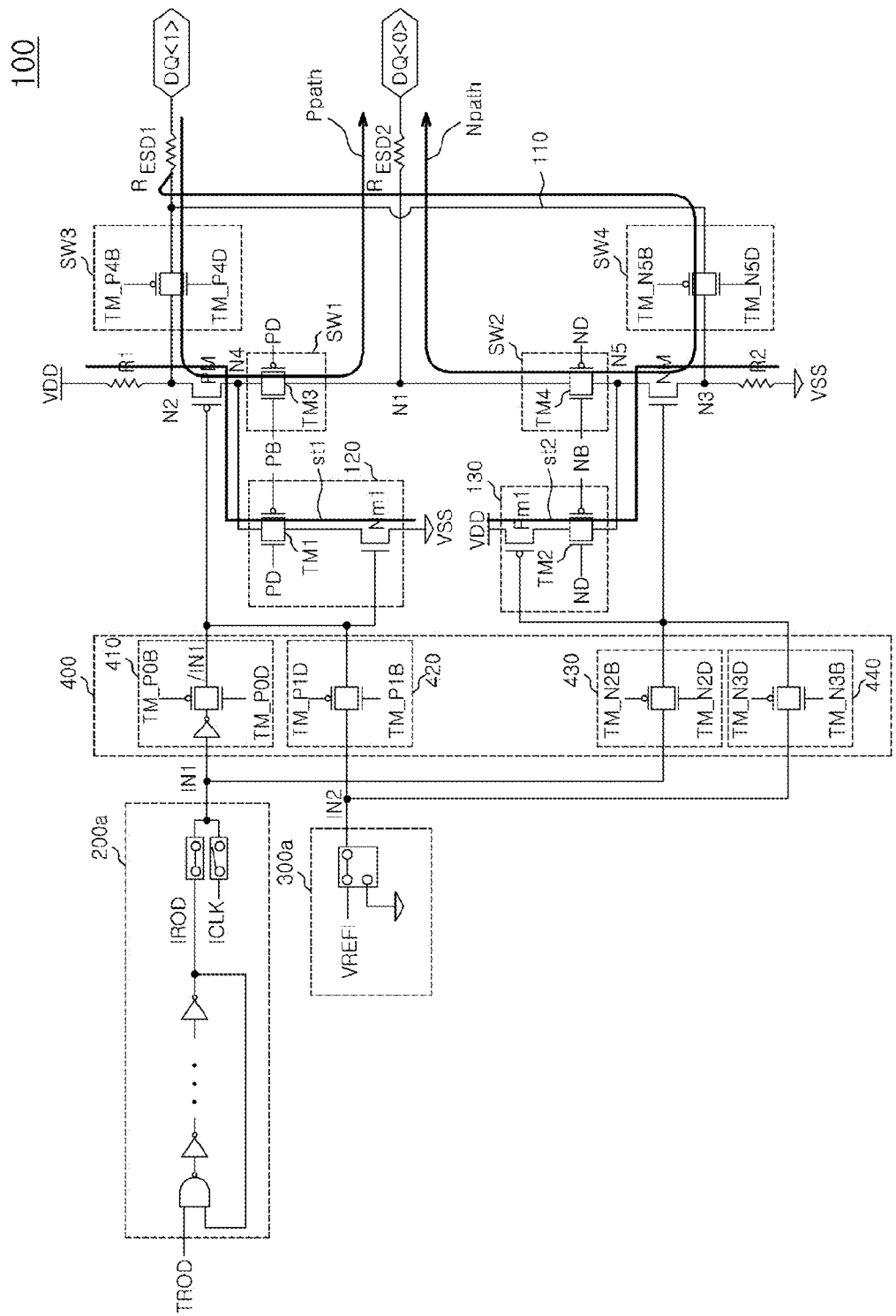
FIG. 11 is a detailed circuit diagram illustrating the semiconductor integrated circuit device of FIG. 10.

Referring to FIG. 11, a detailed circuit diagram illustrating the degradation characteristic detecting apparatus 100 illustrated in FIG. 10 is described.

In FIG. 11, the degradation characteristic detecting apparatus 100 according to an embodiment may include the AC input signal generating unit 200a, the DC input signal generating unit 300a, the input signal selection unit 400, the PMOS transistor PM and the NMOS transistor NM constituting the inverter for a measurement target, the first stress application unit 120, the second stress application unit 130, and the first to fourth switching units SW1, SW2, SW3, and SW4.

The AC input signal generating unit 200a includes a ROD cell including a plurality of inverter chains, and generate an AC pulse input signal IN1. Further, an external clock ICLK may be provided through the AC input signal generating unit 200a and used as the AC pulse input signal IN1.

The DC input signal generating unit 300a generates a DC input signal IN2.

The input signal selection unit 400 may include first to fourth selectors 410, 420, 430, and 440. Each of the first to fourth selectors 410, 420, 430, and 440 may include a transfer gate.

Figure 12:
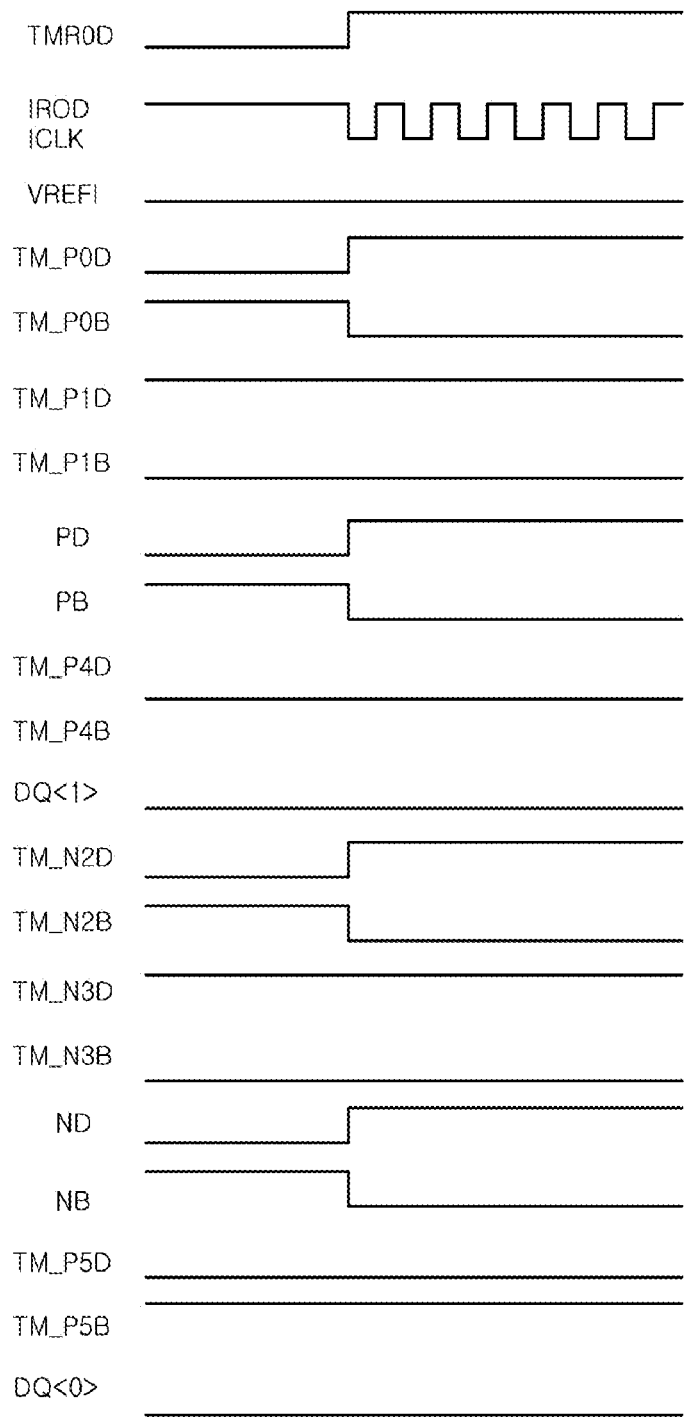
FIG. 12 is a timing chart explaining an operation of a semiconductor integrated circuit device when an AC input signal is applied according to an embodiment of the inventive concept.

For example, when the AC pulse input signal IN1 of the AC input signal generating unit 200a is selected, the first and third selectors 410 and 430 may be driven and the second and fourth selectors may not be driven through TM_POB, TM_POD, TM_POD, TM_P1B, TM_N2B, TM_N2D, TM_N3D, and TM_N3B as illustrated in FIG. 12. Therefore, the AC pulse input signal IN1 may be provided to the inverter PM and NM and the first and second stress application units 120 and 130.

Figure 13:
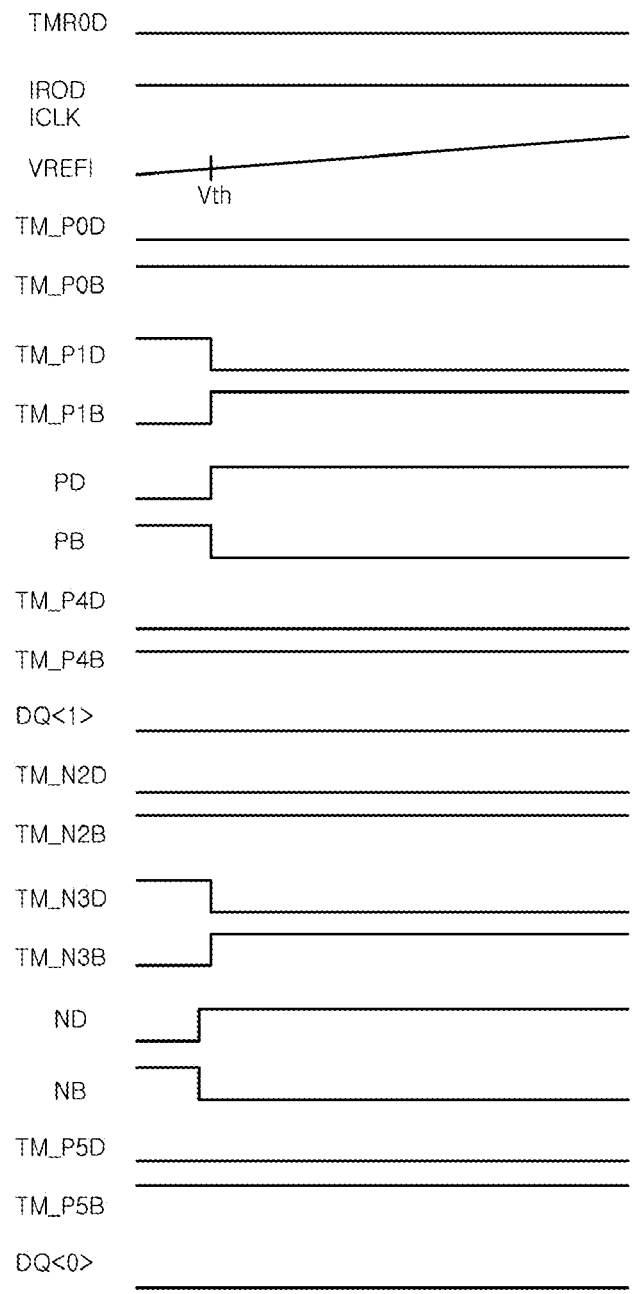
FIG. 13 is a timing chart explaining an operation of a semiconductor integrated circuit device when an DC input signal is applied according to an embodiment of the inventive concept.

When the DC input signal IN2 of the DC input signal generating unit 300a is selected, the first and third selectors 410 and 430 may not be driven and the second and fourth selectors may be driven through TM_POB, TM_POD, TM_POD, TM_P1B, TM_N2B, TM_N2D, TM_N3D, and TM_N3B as illustrated in FIG. 13. Therefore, the DC input signal IN2 may be provided to the inverter PM and NM and the first and second stress application units 120 and 130. The first stress application unit 120 may include a first transfer gate TM1 and an NMOS transistor Nm1. The first transfer gate TM1 is electrically coupled between a drain node N4 of the PMOS transistor PM constituting the inverter and the NMOS transistor Nm1, and driven by first and second control signals PD and PB. The NMOS transistor Nm1 is electrically coupled between the first transfer gate TM1 and a ground terminal VSS, and driven in response to the selected input signal.

The second stress application unit 130 may include a PMOS transistor Pm1 and the second transfer gate TM2. The PMOS transistor Pm1 is electrically coupled between the power voltage terminal VDD and the second transfer gate TM2, and driven in response to the selected input signal. The second transfer gate TM2 may be electrically coupled between the PMOS transistor Pm1 and a drain node N5 of the NMOS transistor NM constituting the inverter. The second transfer gate TM2 may be driven by third and fourth control signals ND and NB.

The first switching unit SW1 may be configured in a form of a transfer gate TM3. The first switching unit SW1 may be driven by the first and second control signals PD and PB. The first switching unit SW1 may be designed to be inversely driven to the first transfer gate TM1.

The second switching unit SW2 may also be configured in a form of a transfer gate TM4. The second switching unit SW2 may be driven by the third and fourth control signals ND and NB. The second switching unit SW2 may be designed to be inversely driven to the second transfer gate TM2.

The third and fourth switching units SW3 and SW4 may also be configured of a transfer gate. The third and fourth switching units SW3 and SW4 may be designed to be driven in a current measurement mode by the control signals TM_P4D, TM_P4B, TM_N5D, and TM_N5B.

The reference numerals R1 and R2 denote voltage drop resistors of the inverter. Further, the reference numerals $R_{ESD1}$ and $R_{ESD2}$ denote electrostatic discharge (ESD) resistors electrically coupled to first and second output terminal units DQ<0> and DQ<1>.

Referring to FIGS. 11 and 12, the case in which the AC pulse input signal IN1 (IROD, ICLK) is input to the inverter PM and NM, and the first and second stress application units 120 and 130 will be described.

The AC pulse input signal IN1 (IROD, ILCK) may be generated in a toggle signal form according to enabling of a TROD signal.

As the first and third selectors 410 and 430 of the input signal selection unit 400 are selectively driven, an inverted AC pulse input signal /IN1 is input to the PMOS transistor PM constituting the inverter and the first stress application unit 120. In addition, the AC input pulse signal IN1 is input to the NMOS transistor NM constituting the inverter and the second stress application unit 130.

When the inverted AC pulse input signal /IN1 has a low level, the gate-drain voltage $V_{GD}$ of the PMOS transistor PM has a negative level, and the PMOS transistor PM of the inverter itself is in a condition in which the stress is received. The reference numeral st1 indicates a path which applies the stress to the PMOS transistor PM of the inverter.

In the NMOS transistor NM and the second stress application unit 130 to which the AC pulse input signal IN1 is input, the gate-drain voltage $V_{GD}$ of the NMOS transistor NM has a positive level in the state that the AC pulse input signal IN1 in a high level. In addition, the NMOS transistor NM of the inverter itself is in a condition to receive the stress. The reference numeral st2 indicates a path which applies the stress to the NMOS transistor NM of the inverter. A control signal TMR0D is also illustrated.

Referring to FIGS. 11 and 13, the case in which the DC input signal IN2 (VREFI) is input to the inverter PM and NM, and the first and second stress application units 120 and 130 will be described.

As the second and fourth selectors 420 and 440 of the input signal selection unit 400 are selectively driven, a DC input signal IN2 (VREFI) is input to the PMOS transistor PM and the NMOS transistor NM constituting the inverter, and the first and second stress application units 120 and 130.

The DC input signal IN2 (VREFI) has a form of a voltage gradually increased. Further, the AC pulse input signal IN1 is not generated while the DC input signal IN2 (VREFI) is input.

For example, when the DC input signal IN2 (VREFI) has a level of below a threshold voltage Vth, since a gate level of the PMOS transistor PM of the inverter is smaller than a drain level of the PMOS transistor PM of the inverter according to the first stress application unit 120 and the level of the DC input signal IN2 (VREFI), the stress application condition of the PMOS transistor PM is satisfied.

When the DC input signal IN2 (VREFI) has a level of a threshold voltage or more, since a drain level of the NMOS transistor NM of the inverter becomes smaller than a gate level of the NMOS transistor NM of the inverter according to the second stress application unit and the DC input signal level, the stress application condition of the NMOS transistor NM constituting the inverter is satisfied.

Figure 14:
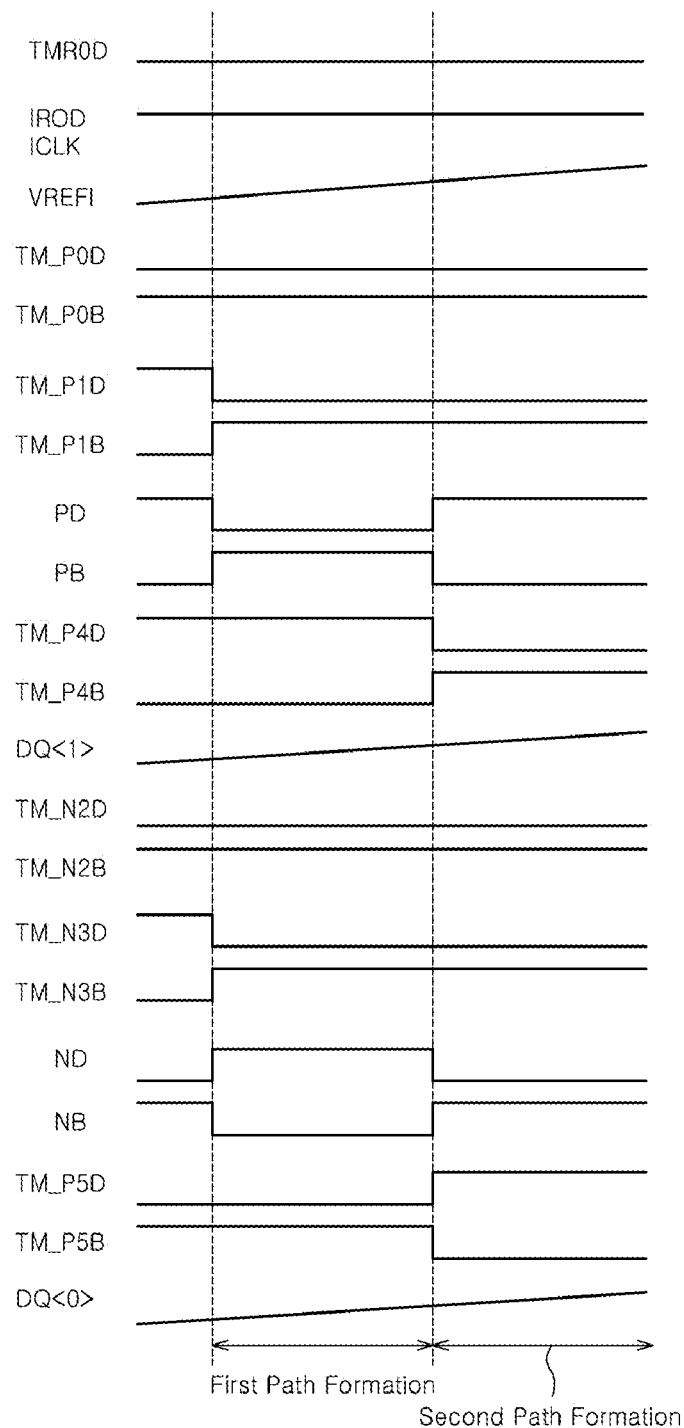
FIG. 14 is a timing chart explaining a degradation measurement operation of a semiconductor integrated circuit device according to an embodiment of the inventive concept.

The degradation measurement mode will be described with reference to FIGS. 11 and 14.

The DC input signal IN2 (VREFI) may be designed to be provided as the input signal other than the AC input signal IN1 (IROD or ICLK) in the degradation measurement mode. Accordingly, the control signals may be generated so that the second and fourth selectors 420 and 440 of the input selection unit 400 are driven. Here, the DC input signal IN2 (VREFI) is gradually increased from the low level to the high level.

In the degradation measurement mode, levels of the first to fourth control signals PD, PB, ND, and NB may be changed so that the first and second transfer gates TM1 and TM2 of the first and second stress application units 120 and 130 are turned off. In addition, the first and second switching units SW1 and SW2 are turned on.

Then, the control signals TM_P4D, TM_P4B, TM_N5D, and TM_N5B are controlled so that the third switching unit SW3 is turned on, and the fourth switching unit SW4 is turned off. Accordingly, the first current path Ppath is formed between the first output terminal unit DQ<0> and the second output terminal unit DQ<1>. In addition, the degree of degradation in the PMOS transistor PM itself constituting the inverter may be determined by the current amount of the first current path Ppath.

The control signals TM_P4D, TM_P4B, TM_N5D, and TM_N5B are controlled so that the third switching unit SW3 is turned off, and the fourth switching unit SW4 is turned on. Thus, the second current path Npath is formed between the first output terminal unit DQ<0> and the second output terminal unit DQ<1> through the loop forming unit 110. Further, the degree of gradation in the NMOS transistor NM itself constituting the inverter may be determined by the current amount of the second current path Npath. A first path information and a second path information are also illustrated.

Figure 15:
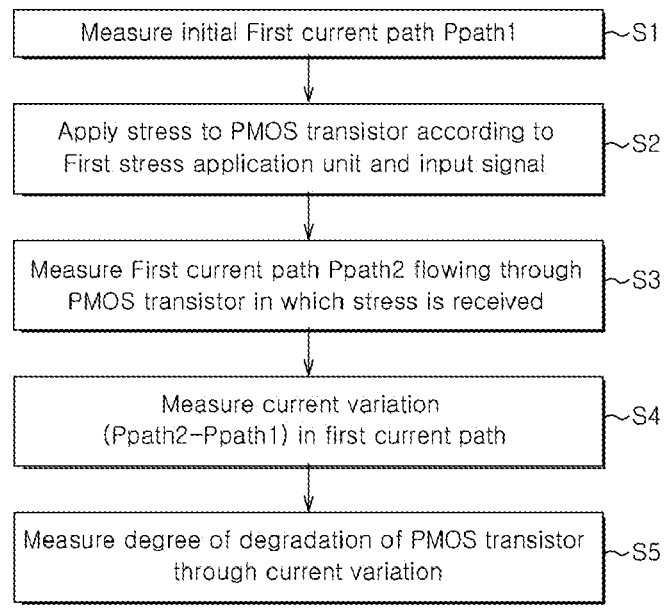
FIG. 15 is a flowchart illustrating a method of measuring degree of degradation of a PMOS transistor of a semiconductor integrated circuit device according to an embodiment of the inventive concept.

Referring to FIG. 15, a method of determining degradation of a PMOS transistor will be described.

First, only the first and third switching units SW1 and SW3 are turned on, and a current amount of an initial first current path Ppath1 is measured (S1). When the PMOS transistor PM is not driven, the initial first current path Ppath1 may not be formed, and the current amount of the initial first current path Ppath1 becomes 0 (zero). When the PMOS transistor PM is driven, the initial first current path Ppath1 may have a certain current value.

Then, the first stress application unit 120 is driven through control of the levels in the input signal and the first and second control signals PB and PD. Individual stress is applied to the PMOS transistor PM constituting the inverter according to the first stress application unit 120 and the input signal (S2).

A current amount of a first current path Ppath2 is measured under the same condition as in operation S1 again (S3). Since the first current path Ppath2 in operation S3 is formed to pass through the PMOS transistor PM in which the stress is received, the current value of the first current path Ppath2 may be different from the current value of the initial first current path Ppath1.

Then, current variation in the PMOS transistor PM is measured through comparison of the current amounts between the initial first current path Ppath1 and the first current path Ppath2 (S4). For example, when the PMOS transistor PM is degraded, the current amount of the first current path Ppath2 is relatively larger than that of the initial first current path Ppath1.

Through the current variation, the degree of degradation of the PMOS transistor PM according to the stress effect is determined (S5).

Figure 16:
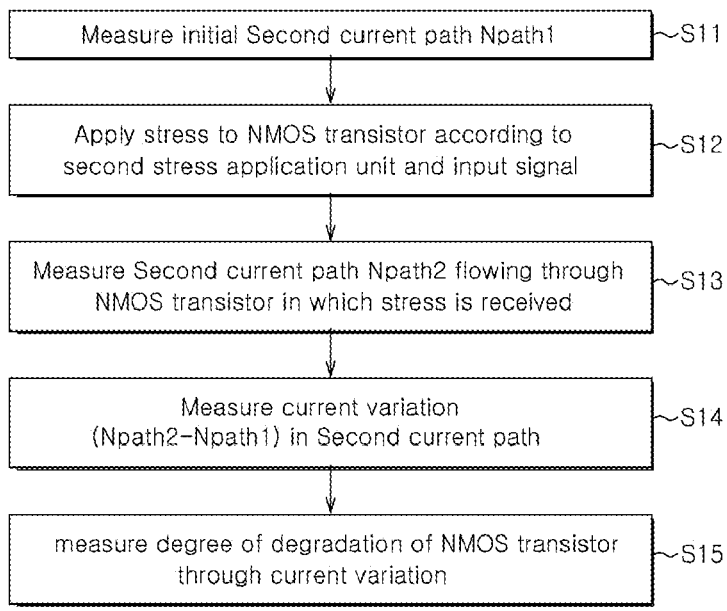
FIG. 16 is a flowchart illustrating a method of measuring degree of degradation of an NMOS transistor of a semiconductor integrated circuit device according to an embodiment of the inventive concept.

Referring to FIG. 16, a method of determining degradation of an NMOS transistor will be described in detail.

First, only the second and fourth switching units SW2 and SW4 are turned on. In addition, a current amount of an initial second current path Npath1 is measured (S11). When the NMOS transistor NM is not driven, the initial second current path Npath1 may not be formed, and thus the current amount of the initial second current path Npath1 becomes 0 (zero). When the NMOS transistor NM is driven, the initial second current path Npath1 may have a certain current value.

The second stress application unit 130 is driven through the control of the levels of the input signal and the third and fourth control signals NB and ND. Individual stress is applied to the NMOS transistor NM constituting an inverter (S12).

A second current path Npath2 is measured under the same condition as in operation S11 again (S13). Since the second current path Npath2 in operation S13 is formed to pass through the NMOS transistor NM in which the stress is received, the current amount of the second current path Npath2 may be different from the current amount of the initial second current path Npath1.

Then, current variation in the NMOS transistor NM is measured through comparison of the current amounts between the initial second current path Npath1 and the second current path Npath2 (S14). For example, when the NMOS transistor NM is degraded by the stress, the current amount of the second current path Npath2 is relatively larger than that of the initial second current path Npath1.

Through the current variation, the degree of degradation of the NMOS transistor NM according to the stress effect is determined (S15).

According to the above-described embodiments, the stress application units are provided in the PMOS transistor and the NMOS transistor of an inverter, respectively. Further, the output terminal units are arranged to generate the PMOS transistor current path and the NMOS transistor current path.

Accordingly, individual degrees of the PMOS transistor and NMOS transistor according to an AC bias or a DC bias may be measured on a die.

Figure 17:
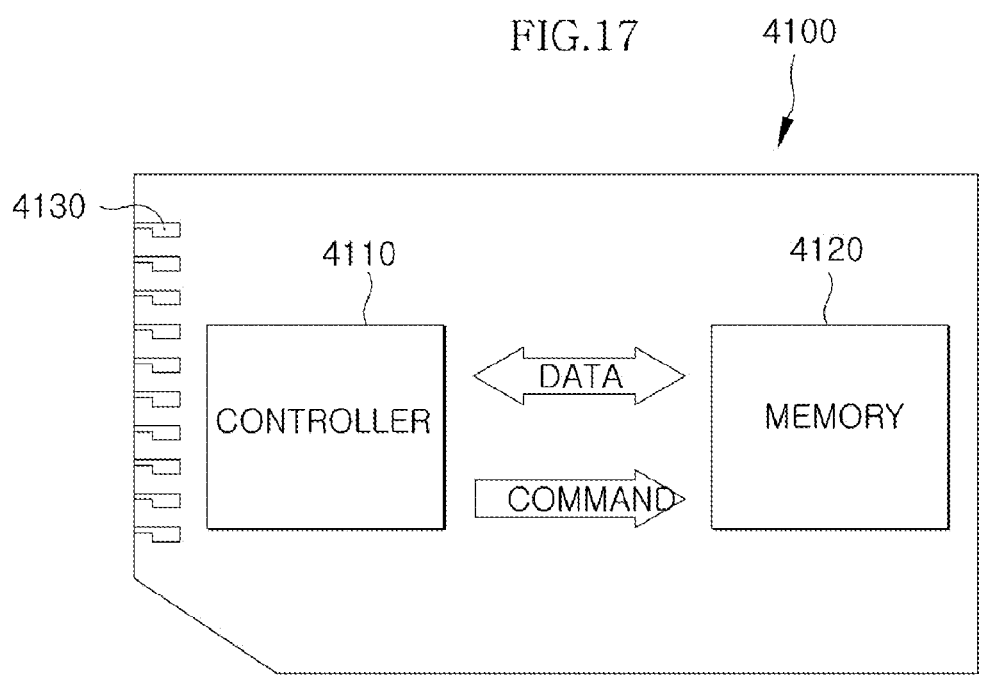
FIG. 17 is a schematic diagram illustrating a representation of an example of a memory card according to an embodiment of the inventive concept.

Referring to FIG. 17, a schematic diagram illustrating a representation of an example of a memory card having a semiconductor integrated circuit device according to various embodiments of the invention is described.

In FIG. 17, a memory card system 4100 including a controller 4110, a memory 4120, and an interface member 4130 may be provided. The controller 4110 and the memory 4120 may be configured to exchange a command and/or data. For example, the memory 4120 may be used to store a command to be executed by the controller 4110 and/or user data.

The memory card system 4100 may store data in the memory 4120 or output data from the memory 4120 to the outside. The memory 4120 may include the semiconductor integrated circuit device according to any one of the above-described embodiments.

The interface member 4130 may function to input and output data from and to the outside. The memory card system 4100 may be a multimedia card (MMC), a secure digital card (SD) or a portable data storage device.

Figure 18:
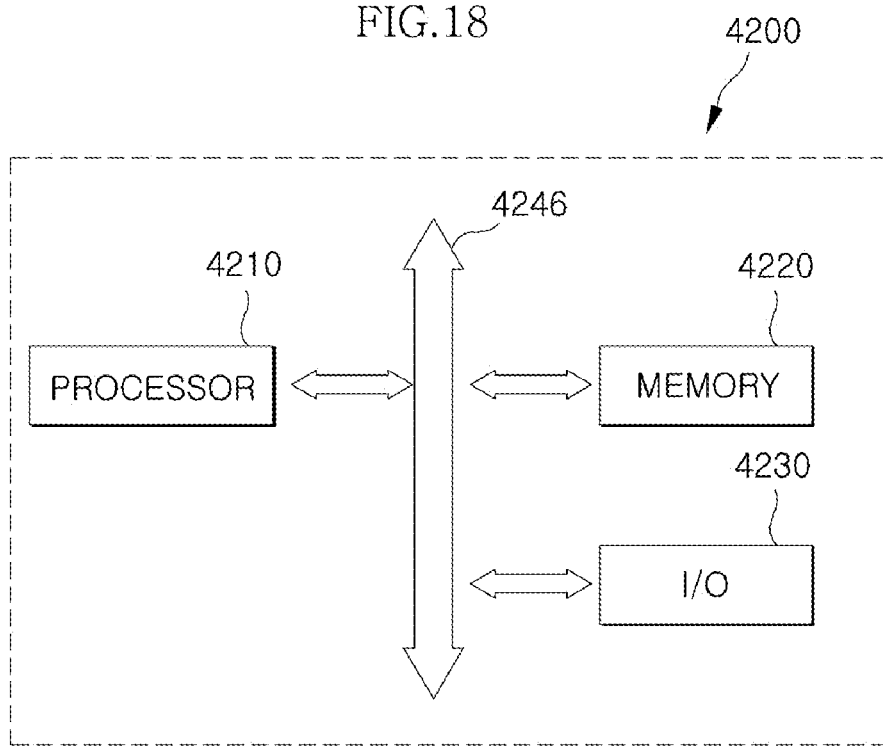
FIG. 18 is a block diagram illustrating a representation of an example of an electronic system according to an embodiment of the inventive concept.

Referring to FIG. 18, a block diagram illustrating a representation of an example of an electronic apparatus having a semiconductor integrated circuit device according to various embodiments of the invention is described.

In FIG. 18, an electronic apparatus 4200 including a processor 4210, a memory 4220, and an input/output (I/O) device 4230 may be provided. The processor 4210, the memory 4220, and the I/O device 4230 may be electrically coupled through a bus 4246.

The memory 4220 may receive a control signal from the processor 4210. The memory 4220 may store a code and data for the operation of the processor 4210. The memory 4220 may be used to store data to be accessed through the bus 4246.

The memory 4220 may include the semiconductor integrated circuit device according to any one of the above-described embodiments. In order for detailed realization and modification, additional circuits and control signals may be provided.

The electronic apparatus 4200 may constitute various electronic control apparatuses which need the memory 4220. For example, the electronic apparatus 4200 may be used in a computer system or a wireless communication device, such as a personal digital assistant (PDA), a laptop computer, a portable computer, a web tablet, a wireless phone, a portable phone, a digital music player, an MP3 player, a navigator, a solid state disk (SSD), a household appliance, or any device capable of transmitting and receiving information under wireless circumstances.

Descriptions will be made below for the detailed realization and modified examples of the electronic apparatus 4200, with reference to FIGS. 19 and 20.

Figure 19:
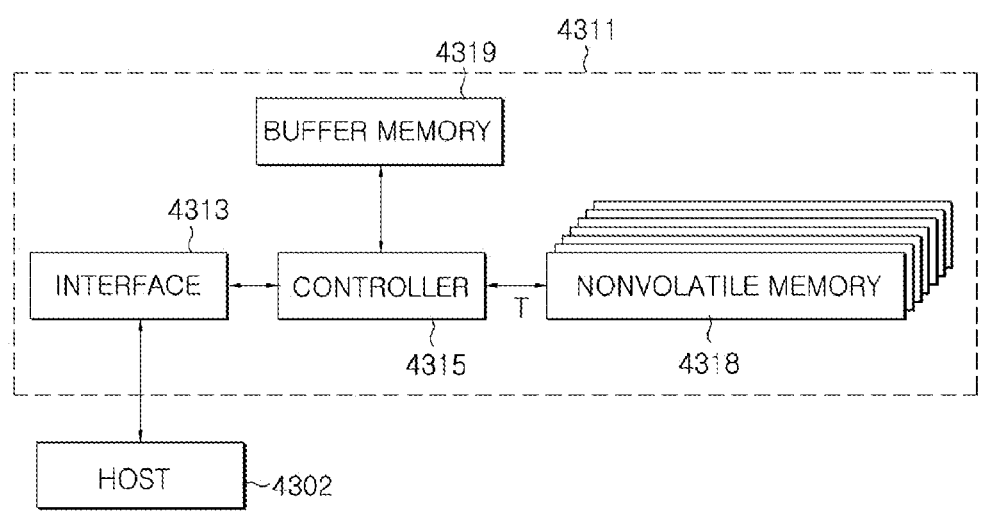
FIG. 19 is a block diagram illustrating a representation of an example of a data storage apparatus according to an embodiment of the inventive concept.

Referring to FIG. 19, a block diagram illustrating a representation of an example of a data storage apparatus having a semiconductor integrated circuit device according to various embodiments of the invention is described.

In FIG. 19, a data storage apparatus 4311 such as a solid state disk (SSD) may be provided. The SSD 4311 may include an interface 4313, a controller 4315, a nonvolatile memory 4318, and a buffer memory 4319.

The SSD 4311 is an apparatus which stores information using a semiconductor device. The SSD 4311 is faster, has a lower mechanical delay or failure rate. The SSD 4311 also generates less heat and noise than a hard disk drive (HDD). Further, the SSD 4311 may be smaller and lighter than the HDD. The SSD 4311 may be widely used in a laptop PC, a net book, a desktop PC, an MP3 player, or a portable storage device.

The controller 4315 may be formed adjacent to the interface 4313 and may be electrically coupled to the interface 4313. The controller 4315 may be a microprocessor including a memory controller and a buffer controller. The nonvolatile memory 4318 may be formed adjacent to the controller 4315 and may be electrically coupled to the controller 4315 via a connection terminal T. The data storage capacity of the SSD 4311 may correspond to the nonvolatile memory 4318. The buffer memory 4319 may be formed adjacent to the controller 4315 and may be electrically coupled to the controller 4315.

The interface 4313 may be electrically coupled to a host 4302. The interface 4313 may function to transmit and receive electrical signals such as data to and from the host 4302. For example, the interface 4313 may be a device which uses the same standard as SATA, IDE, SCSI, and/or a combination thereof. The nonvolatile memory 4318 may be electrically coupled to the interface 4313 via the controller 4315.

The nonvolatile memory 4318 may function to store the data received through the interface 4313.

The nonvolatile memory 4318 may include the semiconductor integrated circuit device according to any one of the above-described embodiments. The nonvolatile memory 4318 has a characteristic that the data stored therein is retained even when power supply to the SSD 4311 is interrupted.

The buffer memory 4319 may include a volatile memory. The volatile memory may be a DRAM and/or an SRAM. The buffer memory 4319 has relatively higher operation speed than the nonvolatile memory 4318.

The data processing speed of the interface 4313 may be relatively faster than the operation speed of the nonvolatile memory 4318. The buffer memory 4319 may function to temporarily store data. The data received through the interface 4313 may be temporarily stored in the buffer memory 4319 via the controller 4315. The data may then, be permanently stored in the nonvolatile memory 4318 in conformity with the data recording speed of the nonvolatile memory 4318.

The data frequently used among the data stored in the nonvolatile memory 4318 may be read in advance and may be temporarily stored in the buffer memory 4319. Namely, the buffer memory 4319 may function to increase the effective operation speed of the SSD 4311 and reduce an error occurrence rate.

Figure 20:
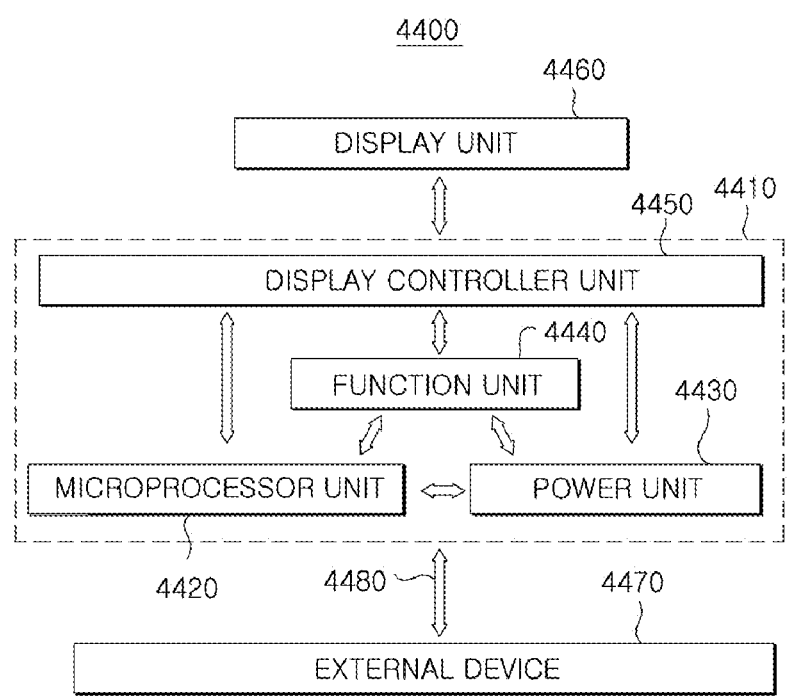
FIG. 20 is a block diagram illustrating a representation of an example of an electronic apparatus according to an embodiment of the inventive concept.

Referring to FIG. 20, a system block diagram illustrating a representation of an example of an electronic apparatus having a semiconductor integrated circuit device according to various embodiments of the invention are shown.

In FIG. 20, an electronic system 4400 including a body 4410, a microprocessor unit 4420, a power unit 4430, a function unit 4440, and a display controller unit 4450 may be provided.

The body 4410 may be a mother board which is formed of a printed circuit board (PCB). The microprocessor unit 4420, the power unit 4430, the function unit 4440, and the display controller unit 4450 may be mounted on the body 4410. A display unit 4460 may be disposed inside the body 4410 or outside the body 4410. For example, the display unit 4460 may be disposed on a surface of the body 4410. The display unit 4460 may display the image processed by the display controller unit 4450.

The power unit 4430 may function to receive a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430 and control the function unit 4440 and the display unit 4460. The function unit 4440 may perform various functions of the electronic system 4400. For example, when the electronic system 4400 is a portable phone, the function unit 4440 may include various components capable of performing portable phone functions, such as output of an image to the display unit 4460 or output of a voice to a speaker, by dialing or communication with an external device 4470. When a camera is mounted together, the function unit 4440 may serve as a camera image processor.

When the electronic system 4400 is electrically coupled to a memory card or the like to increase capacity, the function unit 4440 may be a memory card controller. The function unit 4440 may exchange signals with the external device 4470 through a wired or wireless communication unit 4480. When the electronic system 4400 needs a universal serial bus (USB) or the like to expand functions thereof, the function unit 4440 may serve as an interface controller. Any one semiconductor integrated circuit device among the semiconductor integrated circuit devices according to the above-described embodiments may be applied to at least any one of the microprocessor unit 4420 and the function unit 4440.

The above embodiment of the invention is illustrative and not limitative. Various alternatives and equivalents are possible. The invention is not limited by the embodiment described herein. Nor is the invention limited to any specific type of semiconductor device. Other additions, subtractions, or modifications are obvious in view of the disclosure and are intended to fall within the scope of the appended claims.

What is claimed is:

1. A semiconductor integrated circuit device comprising:
   an NMOS transistor electrically coupled to a PMOS transistor and configured to constitute an inverter together with the PMOS transistor;
   a first stress application unit electrically coupled to the PMOS transistor and configured to apply stress to the PMOS transistor;
   a second stress application unit electrically coupled to the NMOS transistor and configured to apply the stress to the NMOS transistor,
   a first output terminal unit withdrawn from a connection node of the PMOS transistor and the NMOS transistor;
   a second output terminal unit electrically coupled to a source of the PMOS transistor; and
   a loop forming unit configured to electrically couple the second output terminal unit and a source of the NMOS transistor,
   wherein the first and second output terminals and the loop forming unit are configured to measure a current value of a first current path flowing through the PMOS transistor and a current value of a second current path flowing through the NMOS transistor.

2. The semiconductor integrated circuit device of claim 1, further comprising:
   a plurality of switches configured to allow the first current path flowing through the PMOS transistor and the second current path flowing through the NMOS transistor to be individually formed.

3. The semiconductor integrated circuit device of claim 1, wherein the first stress application unit is configured to allow a gate-drain voltage of the PMOS transistor to have a negative value.

4. The semiconductor integrated circuit device of claim 3, wherein the first stress application unit includes:
   a transfer gate electrically coupled to a drain of the PMOS transistor and driven in response to first and second control signals; and
   a sub NMOS transistor electrically coupled to the transfer gate and configured to discharge a signal transmitted from the transfer gate to a ground terminal in response to an input signal of the inverter.

5. The semiconductor integrated circuit device of claim 1, wherein the second stress application unit is configured to allow a gate-drain voltage of the NMOS transistor to have a positive value.

6. The semiconductor integrated circuit device of claim 5, wherein the second stress application unit includes:
   a sub PMOS transistor electrically coupled to a driving voltage terminal and driven in response to an input signal of the inverter; and
   a transfer gate electrically coupled between the sub PMOS transistor and a drain of the NMOS transistor and driven in response to first and second control signals.

7. The semiconductor integrated circuit device of claim 1, wherein an input signal of the inverter is an AC input signal.

8. The semiconductor integrated circuit device of claim 1, wherein an input signal of the inverter is a DC input signal.

9. The semiconductor integrated circuit device of claim 1, further comprising:
   an AC input signal generating unit configured to provide an input signal of the inverter;
   a DC input signal generating unit configured to provide the input signal of the inverter; and
   a selection unit configured to select one of the AC input signal generating unit and the DC input signal generating unit.

10. A semiconductor integrated circuit device comprising:
    an inverter including a PMOS transistor and an NMOS transistor;
    an input unit configured to transfer an input signal to gates of the PMOS transistor and the NMOS transistor;
    a first stress application unit electrically coupled between the gate and a drain of the PMOS transistor and configured to apply stress to the PMOS transistor;
    a second stress application unit electrically coupled between the gate and a drain of the NMOS transistor and configured to apply the stress to the NMOS transistor;
    a first output terminal unit withdrawn from an output node of the inverter;
    a second output terminal unit withdrawn from a source node of the PMOS transistor;
    a loop forming unit configured to electrically couple a source node of the NMOS transistor and the second output terminal unit;
    a first switching unit electrically coupled between the drain of the PMOS transistor and an output node of the inverter;
    a second switching unit electrically coupled between the output node of the inverter and the drain of the NMOS transistor;
    a third switching unit located in the second output terminal unit; and
    a fourth switching unit located in the loop forming unit.

11. The semiconductor integrated circuit device of claim 10, wherein when a current path flowing through the PMOS transistor is formed, the first and third switching units are turned on, and the second and fourth switching units are turned off.

12. The semiconductor integrated circuit device of claim 10, wherein when a current path flowing through the NMOS transistor is formed, the first and third switching units are turned off, and the second and fourth switching units are turned on.

13. The semiconductor integrated circuit device of claim 11, wherein the input unit includes:
an AC input signal generating unit;
a DC input signal generating unit; and
a selection unit configured to select one of the AC input signal generating unit and the DC input signal generating unit.

14. The semiconductor integrated circuit device of claim 10, wherein the first stress application unit includes:
a transfer gate electrically coupled to the drain of the PMOS transistor and driven in response to first and second control signals; and
a sub NMOS transistor electrically coupled to the transfer gate and configured to discharge a signal transmitted from the transfer gate to a ground terminal in response to an input signal of the inverter.

15. The semiconductor integrated circuit device of claim 10, wherein the second stress application unit includes:
a sub PMOS transistor electrically coupled to a driving voltage terminal and driven in response to an input of the inverter; and
a transfer gate electrically coupled between the sub PMOS transistor and the drain of the NMOS transistor and driven in response to first and second control signals.

16. A method of measuring a degree of degradation in each of a PMOS transistor and an NMOS transistor in an inverter structure including the PMOS transistor, the NMOS transistor, a first switching unit electrically coupled between the drain of the PMOS transistor and an output node of the inverter, a second switching unit electrically coupled between the output node of the inverter and the drain of the NMOS transistor, a third switching unit located in the second output terminal unit; and a fourth switching unit located in the loop forming unit, the method comprising:
measuring an initial first current path flowing through the PMOS transistor in a state in which a current path flowing through the NMOS transistor is blocked;
applying stress to the PMOS transistor by providing a gate-drain voltage of the PMOS transistor having a negative level;
checking whether a first current path flowing through the PMOS transistor in which the stress is received is generated when the first and third switching units are turned on and the second and fourth switching units are turned off; and
measuring the degree of degradation in the PMOS transistor through a variation in the first current path.

17. The method of claim 16, further comprising:
measuring an initial second current path flowing through the NMOS transistor in a state in which a current path flowing through the PMOS transistor is blocked;
applying the stress to the NMOS transistor by providing a gate-drain voltage of the NMOS transistor having a positive level;
checking whether a second current path flowing through the NMOS transistor in which the stress is received is generated, when the first and third switching units are turned off and the second and fourth switching units are turned on; and
measuring the degree of degradation in the NMOS transistor through a variation in the second current path.

18. A semiconductor integrated circuit device comprising:
first and second transistors driven by a first power voltage or a second power voltage and electrically coupled to be driven as an inverter in stress application; and
a selection cutting circuit unit selectively electrically coupled to the first and second transistors, and configured to allow a degree of degradation to be separately measured in the first and second transistors in a measurement mode,
wherein the selection cutting circuit unit includes:
a first switching unit electrically coupled between a drain of the first transistor and a connection node of the first and second transistors;
a second switching unit electrically coupled between the connection node and a drain of the second transistor;
a first output terminal unit withdrawn from the connection node;
a second output terminal unit withdrawn from a source node of the first transistor;
a loop forming unit configured to electrically couple a source of the second transistor and the second output terminal unit;
a third switching unit located in the second output terminal unit; and
a fourth switching unit located in the loop forming unit.

19. The semiconductor integrated circuit device of claim 18, further comprising:
a first stress application unit electrically coupled between a gate and a drain of the first transistor and configured to apply stress to the first transistor; and
a second stress application unit electrically coupled between a gate and a drain of the second transistor and configured to apply the stress to the second transistor.

20. The semiconductor integrated circuit device of claim 18, wherein a first current path to measure the degree of the degradation is generated.

21. The semiconductor integrated circuit device of claim 20, wherein a second current path to measure an other degree of the degradation is generated.

22. The semiconductor integrated circuit device of claim 21, wherein the other degree of degradation is measured by a current amount of the second current path.

23. The semiconductor integrated circuit device of claim 21, wherein the degree of degradation is measured by a current amount of the first current path.

24. The semiconductor integrated circuit device of claim 21, wherein when the first transistor is not degraded, the first current path is not formed in a state in which an input signal has a high level.

25. The semiconductor integrated circuit device of claim 21, wherein when the second transistor is not degraded, the second current path is not formed in a state in which an input signal has a low level.

26. The semiconductor integrated circuit device of claim 25, further comprising:
an internal voltage generating unit wherein an internal voltage is generated as the input signal.

27. The semiconductor integrated circuit device of claim 21, wherein when a gate level of the first transistor is less than a drain level of the first transistor, a stress application condition of the first transistor is satisfied.

* * * * *